United States Patent
Bae et al.

(10) Patent No.: US 9,679,874 B2
(45) Date of Patent: Jun. 13, 2017

(54) SEMICONDUCTOR PACKAGE AND SEMICONDUCTOR DEVICE INCLUDING THE SAME

(71) Applicant: Samsung Electronics Co., Ltd., Suwon-si, Gyeonggi-do (KR)

(72) Inventors: Jin-Kwon Bae, Hwaseong-si (KR); Jae Choon Kim, Incheon (KR); Jichul Kim, Yongin-si (KR); Kyol Park, Cheonan-si (KR); Chajea Jo, Incheon (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/938,788

(22) Filed: Nov. 11, 2015

(65) Prior Publication Data

US 2016/0133605 A1 May 12, 2016

(30) Foreign Application Priority Data

Nov. 11, 2014 (KR) .................. 10-2014-0156182

(51) Int. Cl.
*H01L 23/31* (2006.01)
*H01L 23/498* (2006.01)
(Continued)

(52) U.S. Cl.
CPC .......... *H01L 25/0657* (2013.01); *H01L 23/36* (2013.01); *H01L 23/5385* (2013.01); *H01L 24/00* (2013.01); *H01L 25/0655* (2013.01); *H01L 23/367* (2013.01); *H01L 23/49816* (2013.01); *H01L 23/49827* (2013.01); *H01L 2224/16145* (2013.01); *H01L 2224/16225* (2013.01); *H01L 2224/32225* (2013.01); *H01L 2224/73204* (2013.01);
(Continued)

(58) Field of Classification Search
CPC ............. H01L 25/0657; H01L 25/0655; H01L 23/367; H01L 23/3142; H01L 23/49866; H01L 23/49838
See application file for complete search history.

(56) References Cited

U.S. PATENT DOCUMENTS 3,957,170 A 5/1976 Kotcharian
5,966,022 A 10/1999 Budnaitis et al.
(Continued)

FOREIGN PATENT DOCUMENTS

JP 4572243 B2 8/2010
JP 2014106095 A 6/2014
(Continued)

*Primary Examiner* — Peniel M Gumedzoe
(74) *Attorney, Agent, or Firm* — Renaissance IP Law Group LLP

(57) ABSTRACT

A semiconductor device includes a substrate, a first semiconductor package disposed on the substrate, and a second semiconductor package spaced apart from the first semiconductor package on the substrate. The second semiconductor package includes a semiconductor chip stacked on the substrate, an adhesion part covering the semiconductor chip, and a heat-blocking structure disposed between the substrate and the semiconductor chip. Heat generated from the first semiconductor package and transmitted to the second semiconductor package through the substrate is blocked by the heat-blocking structure.

12 Claims, 11 Drawing Sheets

(51) Int. Cl.
  *H01L 23/367* (2006.01)
  *H01L 25/065* (2006.01)
  *H01L 23/00* (2006.01)
  *H01L 23/36* (2006.01)
  *H01L 23/538* (2006.01)

(52) U.S. Cl.
  CPC ............ *H01L 2225/06555* (2013.01); *H01L 2225/06589* (2013.01); *H01L 2924/15311* (2013.01)

(56) References Cited

U.S. PATENT DOCUMENTS

| | | | |
|---|---|---|---|
| 6,653,171 | B2 | 11/2003 | Ikegami |
| 6,809,421 | B1* | 10/2004 | Hayasaka ......... H01L 21/76898 257/621 |
| 7,199,466 | B2 | 4/2007 | Chiu |
| 7,223,637 | B2 | 5/2007 | Saitou |
| 7,626,260 | B2 | 12/2009 | Chung et al. |
| 8,357,565 | B2 | 1/2013 | Ofner et al. |
| 2002/0048848 | A1 | 4/2002 | Ikegami |
| 2005/0173810 | A1 | 8/2005 | Saitou |
| 2005/0208280 | A1* | 9/2005 | Dias ..................... H01L 21/563 428/209 |
| 2005/0245060 | A1 | 11/2005 | Chiu |
| 2006/0056213 | A1* | 3/2006 | Lee ..................... H01L 23/4334 363/144 |
| 2007/0267738 | A1 | 11/2007 | Chung et al. |
| 2008/0054433 | A1* | 3/2008 | Yoo ..................... H01L 25/0657 257/686 |
| 2010/0052132 | A1* | 3/2010 | Baek ................. H01L 23/49816 257/686 |
| 2010/0303109 | A1 | 12/2010 | Bhagavatula et al. |
| 2011/0020985 | A1 | 1/2011 | Ofner et al. |
| 2011/0267682 | A1 | 11/2011 | Bhagavatula et al. |
| 2012/0098123 | A1* | 4/2012 | Yu ..................... H01L 21/563 257/737 |
| 2012/0317332 | A1* | 12/2012 | Kwak ................ G06F 12/0246 711/102 |
| 2013/0058067 | A1* | 3/2013 | Yee ..................... H01L 23/36 361/820 |
| 2013/0087911 | A1* | 4/2013 | Gregorich ............. H01L 25/105 257/737 |
| 2013/0234320 | A1 | 9/2013 | Lu et al. |
| 2014/0124955 | A1* | 5/2014 | Chen ................. H01L 25/105 257/777 |

FOREIGN PATENT DOCUMENTS

| | | |
|---|---|---|
| KR | 0676315 B1 | 1/2007 |
| KR | 20100034463 A | 4/2010 |

* cited by examiner

US 9,679,874 B2

SEMICONDUCTOR PACKAGE AND SEMICONDUCTOR DEVICE INCLUDING THE SAME

CROSS-REFERENCE TO RELATED APPLICATION

This U.S. non-provisional patent application claims priority under 35 U.S.C. §119 to Korean Patent Application No. 10-2014-0156182, filed on Nov. 11, 2014, in the Korean Intellectual Property Office, the disclosure of which is hereby incorporated by reference in its entirety.

BACKGROUND

The present disclosure relates to a semiconductor package and a semiconductor device including the same.

As performance of electronic products is improved, heat energy generated from semiconductor devices increases. The approach to solve the heat generation problem may be limited to adjust a temperature of the semiconductor device when the temperature of the semiconductor device is equal to or greater than a predetermined temperature. However, the temperature of the semiconductor device rapidly increases as the generated heat energy increases, and thus the performance of the semiconductor device may be lowered due to insufficient heat dissipation. In other words, efficiency of the semiconductor device may be reduced.

SUMMARY

Embodiments of the present disclosure may provide a semiconductor package having a heat-blocking effect.

Embodiments of the present disclosure may also provide a semiconductor device including a semiconductor package having a heat-blocking effect.

In one aspect, a semiconductor device may include: a substrate; a first semiconductor package disposed on the substrate; and a second semiconductor package spaced apart from the first semiconductor package on the substrate. The second semiconductor package may include: a semiconductor chip stacked on the substrate; an adhesion part covering the semiconductor chip; and a heat-blocking structure disposed between the substrate and the semiconductor chip. Heat generated from the first semiconductor package and transmitted to the second semiconductor package through the substrate may be blocked by the heat-blocking structure.

In one embodiment, the adhesion part may include: a first adhesion portion under the semiconductor chip; and a second adhesion portion above the semiconductor chip. The heat-blocking structure may be the first adhesion portion, and the heat-blocking structure may include a void in a first region of the second semiconductor package which is adjacent to the first semiconductor package.

In another embodiment, the heat-blocking structure may include the voids wherein a volume of the voids is greater in the first region than that in a second region of the second semiconductor package which is disposed far away from the first semiconductor package.

In another embodiment, the second semiconductor package may further include: a second semiconductor chip stacked on the semiconductor chip with the second adhesion portion interposed therebetween. The second adhesion portion may include voids in the first region adjacent to the first semiconductor package.

In another embodiment, a volume of the voids of the second adhesion portion may be greater in the first region than those in the second region.

In another embodiment, a volume of the voids may be equal to about a quarter of a volume of the heat-blocking structure.

In another embodiment, the heat-blocking structure may include Teflon.

In another embodiment, the semiconductor device may further include: a third semiconductor package on the substrate. The second semiconductor package may be disposed at a side of the first semiconductor package, and the third semiconductor package may be disposed at another side of the first semiconductor package. The second and third semiconductor packages may be spaced apart from the first semiconductor package, and the third semiconductor package may have the same structure as the second semiconductor package.

In another aspect, a semiconductor package may include: a substrate; a plurality of semiconductor chips stacked on the substrate, the plurality of semiconductor chips including a first semiconductor chip nearest to the substrate; an adhesion part covering the semiconductor chips; and a heat-blocking structure disposed between the substrate and the first semiconductor chip.

In one embodiment, the heat-blocking structure may be a portion of the adhesion part, and the heat-blocking structure may include voids in a first region adjacent to one edge of the first semiconductor chip.

BRIEF DESCRIPTION OF THE DRAWINGS

The embodiments of the present disclosure will become more apparent in view of the attached drawings and accompanying detailed description.

DETAILED DESCRIPTION OF THE EMBODIMENTS

Figure 1:
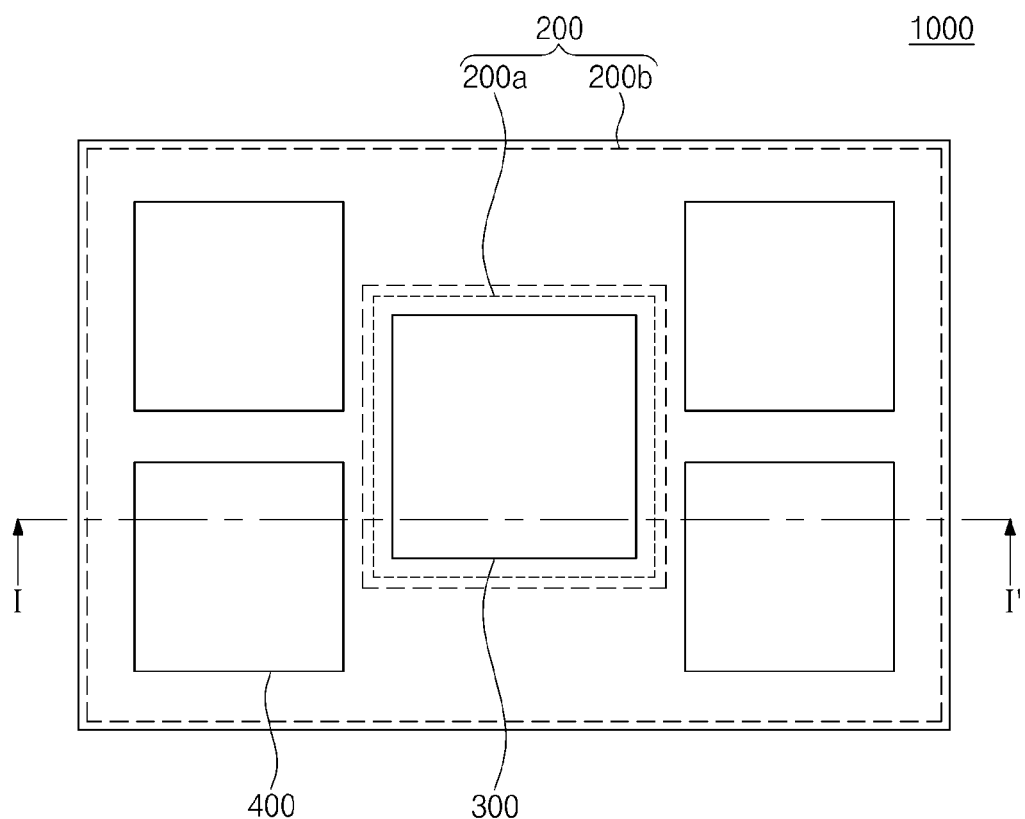
FIG. 1 is a plan view illustrating a semiconductor device including a semiconductor package according to the embodiments of the present disclosure.

The present disclosure will now be described more fully hereinafter with reference to the accompanying drawings, in which exemplary embodiments of the present disclosure are shown. The advantages and features of the present disclosure and methods of achieving them will be apparent from the following exemplary embodiments that will be described in more detail with reference to the accompanying drawings. It should be noted, however, that the present disclosure are not limited to the following exemplary embodiments, and may be implemented in various forms. Accordingly, the exemplary embodiments are provided only to disclose the present disclosure and let those skilled in the art know the category of the present invention. In the drawings, embodiments of the present disclosure are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of present disclosure.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present disclosure. Exemplary embodiments of aspects of the present disclosure explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Figure 2:
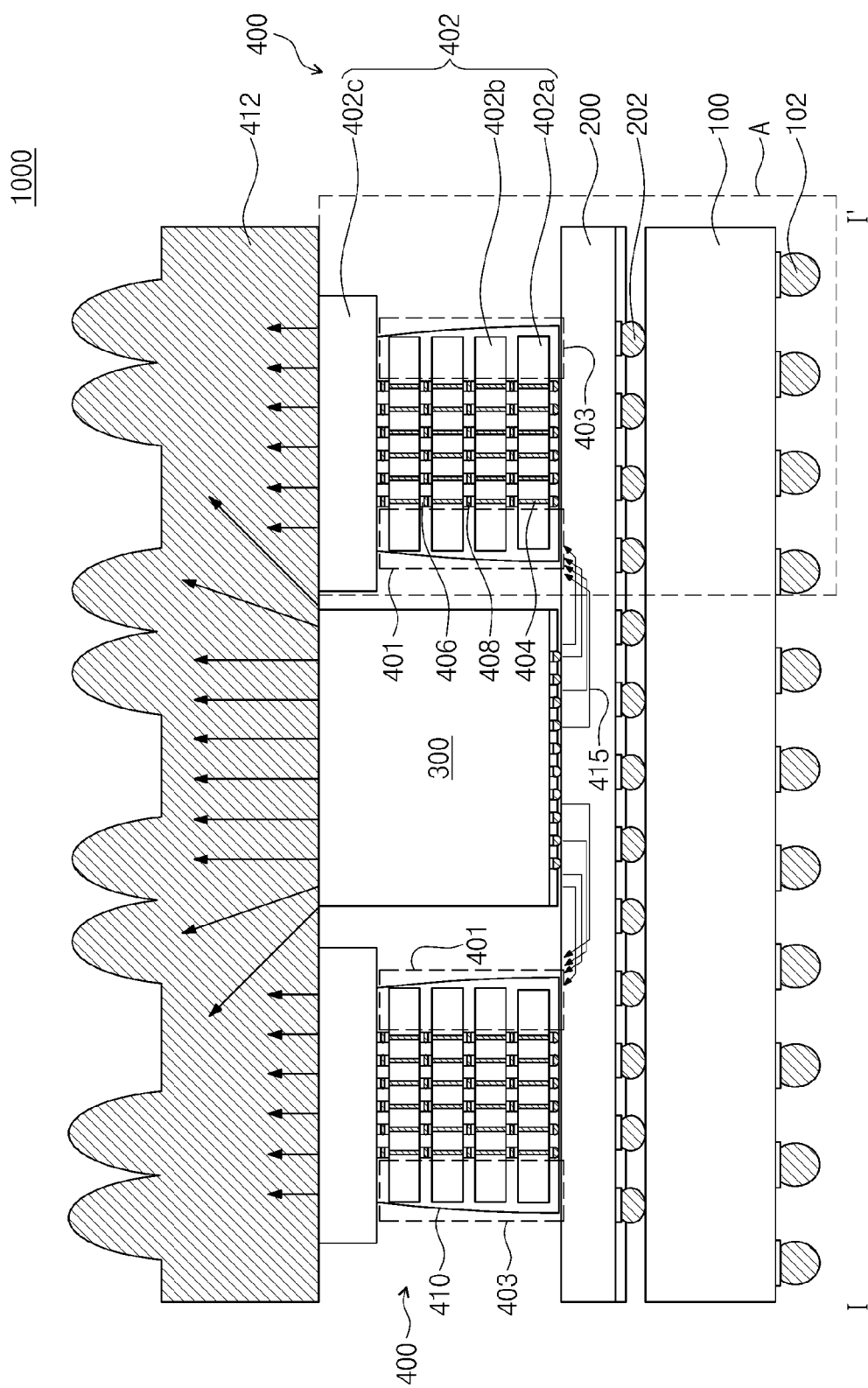
FIG. 2 is a cross-sectional view taken along a line I-I' of FIG. 1 to illustrate a semiconductor device including a semiconductor package according to a first embodiment of the present disclosure.
Figure 3:
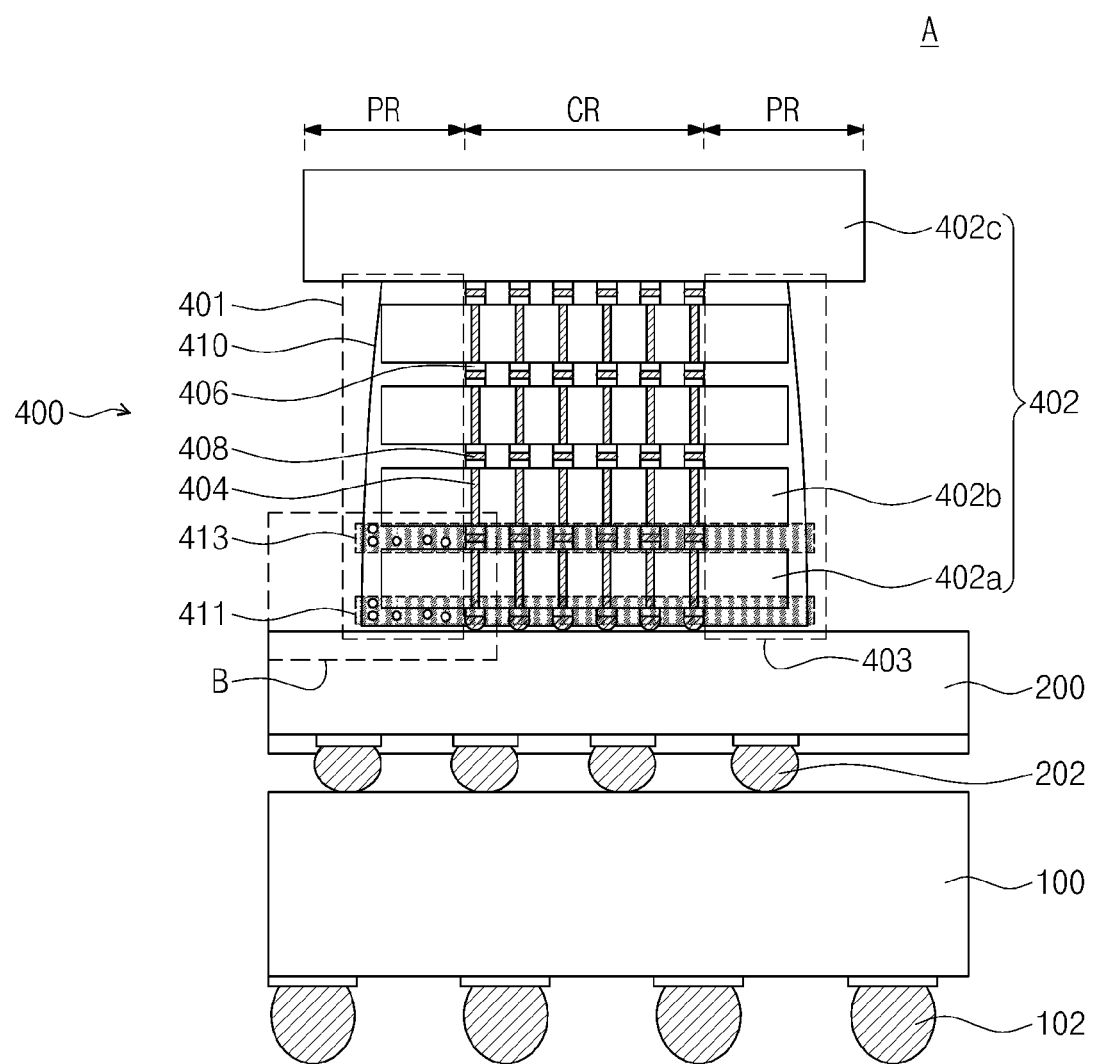
FIG. 3 is an enlarged view of a portion 'A' of FIG. 2 to illustrate a semiconductor device including a semiconductor package according to the first embodiment of the present disclosure.
Figure 4A:
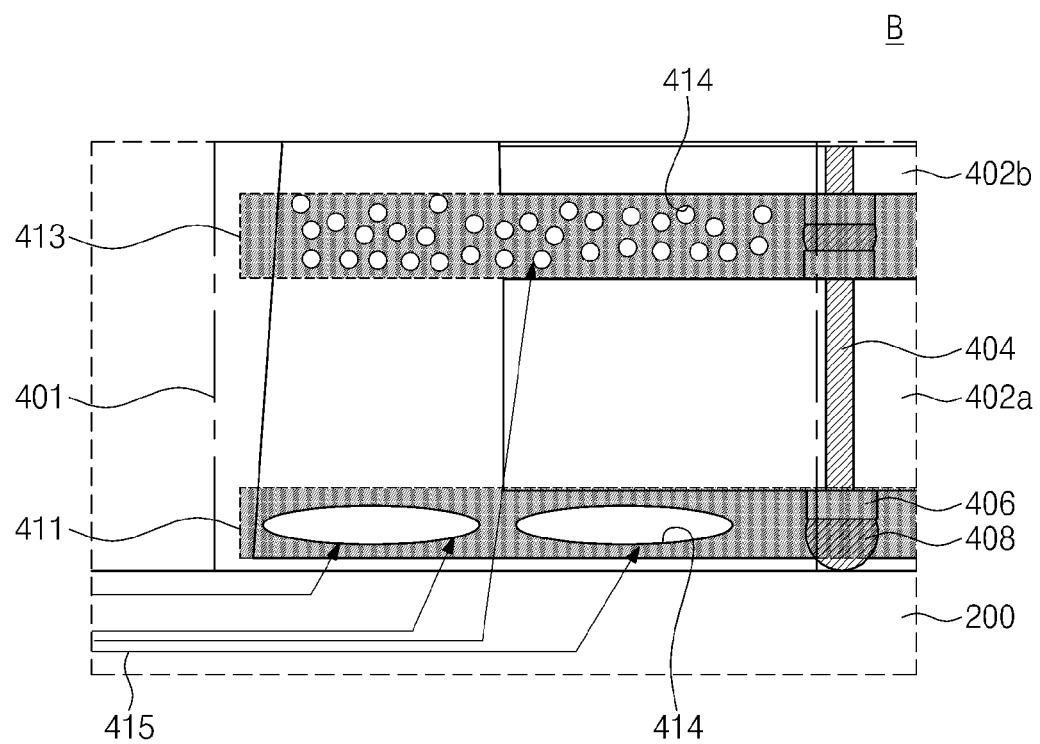
FIGS. 4A and 4B are enlarged views of a portion 'B' of FIG. 3 to illustrate a semiconductor device including a semiconductor package according to the first embodiment of the present disclosure.
Figure 4B:
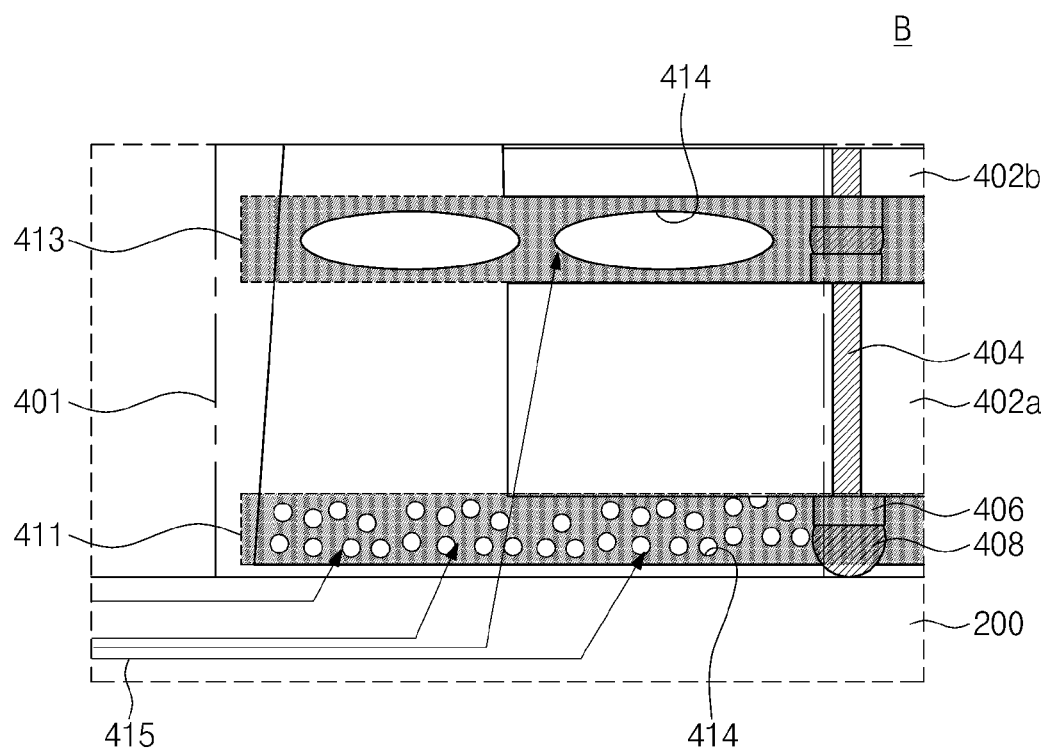

FIG. 1 is a plan view illustrating a semiconductor device including a semiconductor package according to the embodiments of the present disclosure. FIG. 2 is a cross-sectional view taken along a line I-I' of FIG. 1 to illustrate a semiconductor device including a semiconductor package according to a first embodiment of the present disclosure. FIG. 3 is an enlarged view of a portion 'A' of FIG. 2 to illustrate a semiconductor device including a semiconductor package according to the first embodiment of the present disclosure. FIGS. 4A and 4B are enlarged views of a portion 'B' of FIG. 3 to illustrate a semiconductor device including a semiconductor package according to the first embodiment of the present disclosure.

Referring to FIGS. 1 and 2, a semiconductor device 1000 may include a substrate or an interposer substrate 200 stacked on a printed circuit board 100 on which a logic semiconductor package (not shown) is stacked, and first and second semiconductor packages 300 and 400 stacked on the interposer substrate 200. The logic semiconductor package may include a semiconductor chip (not shown) that is mounted on the printed circuit board 100 by a flip chip bonding technique. A first external terminals 102 may be disposed on a bottom surface of the printed circuit board 100. The semiconductor chip may be, for example, a logic semiconductor chip. The first semiconductor package 300 may emit more heat than the second semiconductor package 400. The first semiconductor package 300 may include, for example, a central processing unit (CPU).

A second external terminals 202 may be provided between the interposer substrate 200 and the printed circuit board 100. The interposer substrate 200 may include at least one through-via (not shown) and/or interconnections (not shown). Through the through-via and the interconnections, the logic semiconductor package may be electrically connected to the second semiconductor package 400 and the first semiconductor package 300 may be electrically connected to the second semiconductor package 400.

The first semiconductor package 300 may be disposed on a central portion 200a of the interposer substrate 200 when viewed from a plan view. The second semiconductor package 400 may be disposed on an edge portion 200b of the interposer substrate 200. In an embodiment, a plurality of second semiconductor packages 400 may be spaced apart from each other on the edge portion 200b of the interposer substrate 200, as illustrated in FIGS. 1 and 2. The interposer substrate 200 may have a heat conductivity of about 118 W/mK.

The first semiconductor package 300 may be electrically connected to the second semiconductor package 400 through the interconnections (not shown) formed in the interposer substrate 200. The heat as high as approximately 100 W to about 200 W may be generated from the first semiconductor package 300. A heat slug 412 may be disposed to be adjacent to the first semiconductor package 300 to exhaust/dissipate the heat generated from the first semiconductor package 300 outwardly.

The heat slug 412 may be disposed on the first semiconductor package 300. In one example, the heat slug 412 may be in direct contact with a top surface of the first semiconductor package 300 and a top surface of the uppermost semiconductor chip 402c of the second semiconductor package 400. In some embodiments, a heat pipe and/or a liquid cooling unit may be disposed on the heat slug 412 (not shown in the drawings). In addition, air may be provided to the surface of the heat slug 412. As a result, the heat generated from the first semiconductor package 300 may be exhausted through the cooling units described above. Heat generated from the second semiconductor package 400 may be exhausted through the heat slug 412 as well.

The second semiconductor package 400 may include a central portion (illustrated as CR in FIG. 3) and an edge portion (illustrated as PR in FIG. 3). The second semiconductor package 400 may include a plurality of semiconductor chips 402. The lowermost one of the semiconductor chips 402 may be defined as a first semiconductor chip 402a, and a semiconductor chip stacked directly on the first semiconductor chip 402a may be defined as a second semiconductor chip 402b. The uppermost one of the semiconductor chips 402 may be defined as a third semiconductor chip 402c. In some embodiments, a width of the first semiconductor chip 402a may be greater than that of at least the second semiconductor chip 402b. A width of the third semiconductor chip 402c may be greater than those of the other semiconductor chips 402. In addition, the third semiconductor chip 402c may have a thickness larger than the other semiconductor chips so that the first semiconductor package 300 and the second semiconductor package 400 have approximately the same height.

Each of the semiconductor chips 402 may include at least one through-via 404. The through-via 404 may penetrate each of the semiconductor chips 402. The through-vias 404 may be disposed in the central portion (CR of FIG. 3) of the second semiconductor package 400. The through-vias 404 may be in contact with pads 406 disposed on surfaces of the semiconductor chips 402, and a chip bump 408 may be disposed between the pads 406 facing each other. The through-vias 404 may electrically connect the semiconductor chips 402 to each other. The semiconductor chips 402 may include, for example, memory chips. Thus, the second semiconductor package 400 may be a memory semiconductor package.

Referring to FIGS. 2, 3, 4A and 4B, the second semiconductor package 400 may include an adhesion part 410. The adhesion part 410 may bond the semiconductor chips 402 to each other and may cover sidewalls of the semiconductor chips 402. In one embodiment, the adhesion part 410 may include a first adhesion portion 411 and a second adhesion portion 413. The first adhesion portion 411 may correspond to a portion of the adhesion part 410 that is disposed under the first semiconductor chip 402a. The second adhesion portion 413 may correspond to another portion of the adhesion part 410 that is disposed between the first semiconductor chip 402a and the second semiconductor chip 402b. The adhesion part 410 may be a film-type adhesive. The film-type adhesive may be, for example, a non-conductive film (NCF). The film-type adhesive may be adhered on a semiconductor wafer including the semiconductor chip, and a semiconductor wafer including the semiconductor chip may be adhered on the film-type adhesive. This process may be repeatedly performed. In other words, a plurality of the semiconductor wafers may be stacked using the film-type adhesives. The stacked semiconductor wafers may be cut to form the second semiconductor package 400.

Most of the heat generated from the first semiconductor package 300 may be exhausted through the heat slug 412. However, heat 415 generated in a region of the first semiconductor package 300 located far away from the heat slug 412 and/or heat 415 generated in a bottom end portion of the first semiconductor package 300 may not be exhausted/dissipated, which results in an increased temperature in the second semiconductor package 400 and affect its performance. In particular, the interposer substrate 200 has the heat conductivity of 118 W/mK and the interconnections may be formed of a metal material having high conductivity. Thus, the heat generated from the first semiconductor package 300 may be horizontally transmitted through the interposer substrate 200 and/or the interconnections to increase the temperature of the second semiconductor package 400. Most of the heat 415 may be transmitted to a first region 401 of the second semiconductor package 400. The first region 401 may be a region in a portion of the edge portion PR of the second semiconductor package 400 and is nearest or adjacent to the first semiconductor package 300. The heat 415 transmitted in the first region 401 may increase the temperature of first edges of the first and second semiconductor chips 402a and 402b which are disposed in the first region 401. As a result performance degradation of the first and second semiconductor chips 402a and 402b may be caused.

Less amount of the heat 415 may be transmitted from the interposer substrate 200 and/or the interconnections to a second region 403 of the second semiconductor package 400 which is disposed further from the first semiconductor package 300 than the first region 401 and is disposed in another portion of the edge portion PR of the second semiconductor package 400. The second region 403 of the second semiconductor package 400 may be opposite to the first region 401 in a plan view and may include second edges of the first and second semiconductor chips 402a and 402b. Thus, there may have a temperature difference between the first region 401 and the second region 403 of the second semiconductor package 400. The temperature variation may cause the performance degradation of the first and second semiconductor chips 402a and 402b.

A heat-blocking structure may be disposed in the semiconductor device. The heat-blocking structure may consist of a substance with lower heat conductivity to block the heat 415. In some embodiments, the heat-blocking structure may include a portion of the adhesion part having voids. Referring to FIG. 3, FIGS. 4A and 4B, voids 414 may be included in a first portion of the first adhesion portion 411 and a first portion of the second adhesion portion 413 which are included in the first region 401. The voids 414 may have various sizes and shapes. In an embodiment, a size of the void 414 included in the first portion of the first adhesion portion 411 may be greater than that of the void 414 included in the first portion of the second adhesion portion 413, as illustrated in FIG. 4A. In another embodiment, the size of the void 414 included in the first portion of the first adhesion portion 411 may be smaller than that of the void 414 included in the first portion of the second adhesion portion 413, as illustrated in FIG. 4B. The size, shape and distributing of the voids in the first portion of the first adhesion portion 411 and the first portion of the second adhesion portion 413 are not limited to the embodiments of FIGS. 4A and 4B and various configuration of the voids may be possible. For example, the voids in the first portion of the first adhesion portion 411 and the first portion of the second adhesion portion 413 may have the same size. In another example, the void may be formed of channels inside the adhesion portions. The voids 414 may be filled with air. A volume of the voids 414 included in the first portion of the first adhesion portion 411 overlapping with the first region 401 of the second semiconductor package 400 may be equal to approximately a quarter of a volume of the first adhesion portion 411. A volume of the voids 414 included in the first portion of the second adhesion portion 413 overlapping with the first region 401 of the second semiconductor package 400 may be equal to approximately a quarter of a volume of the second adhesion portion 413.

A second portion of the first adhesion portion 411, which is disposed in the second region 403 of the second semiconductor package 400, may include voids. In one embodiment, a volume occupied by the voids in the second portion of the first adhesion portion 411 is smaller than those of the voids 414 included in the first portion of the first adhesion portion 411. A second portion of the second adhesion portion 413, which is disposed in the second region 403 of the second semiconductor package 400, may include voids. In one embodiment, a volume occupied by the voids in the second portion of the second adhesion portion 413 is smaller than those of the void 414 included in the first portion of the second adhesion portion 413. Alternatively, the voids may not be included in the second portions of the first and second adhesion portions 411 and 413.

The air filling the void 414 may have a heat conductivity of about 0.025 W/mK. Thus, a portion of the heat 415 transmitted from the first semiconductor package 300 may be blocked by the void 414 formed in the first adhesion portion 411 of the adhesion part 410, so that the first semiconductor chip 402a may not be affected by the heat 415. In addition, a portion of the heat 415 which is not blocked by the void 414 of the first adhesion portion 411 may be blocked by the void 414 formed in the second adhesion portion 413 of the adhesion part 410. Thus, it is possible to reduce, minimize or prevent a temperature rise of the first and second semiconductor chips 402a and 402b. In addition, since the temperature difference between the first and second regions 401 and 402 of the second semiconductor package 400 is reduced, the performance degradation of the first and second semiconductor chips 402a and 402b may be minimized or prevented.

As most of the heat generated from the first semiconductor package 300 may be exhausted through the heat slug 412 in a vertical direction, the heat 415 may be effectively blocked by the voids formed in the first and second adhesion portions 411 and 413 of the adhesion part 410. In this way, the semiconductor chips 402 may be sufficiently protected from the heat.

In some embodiments, the heat-block structure may be a heat-blocking layer disposed in the semiconductor package of the semiconductor device.

Figure 5:
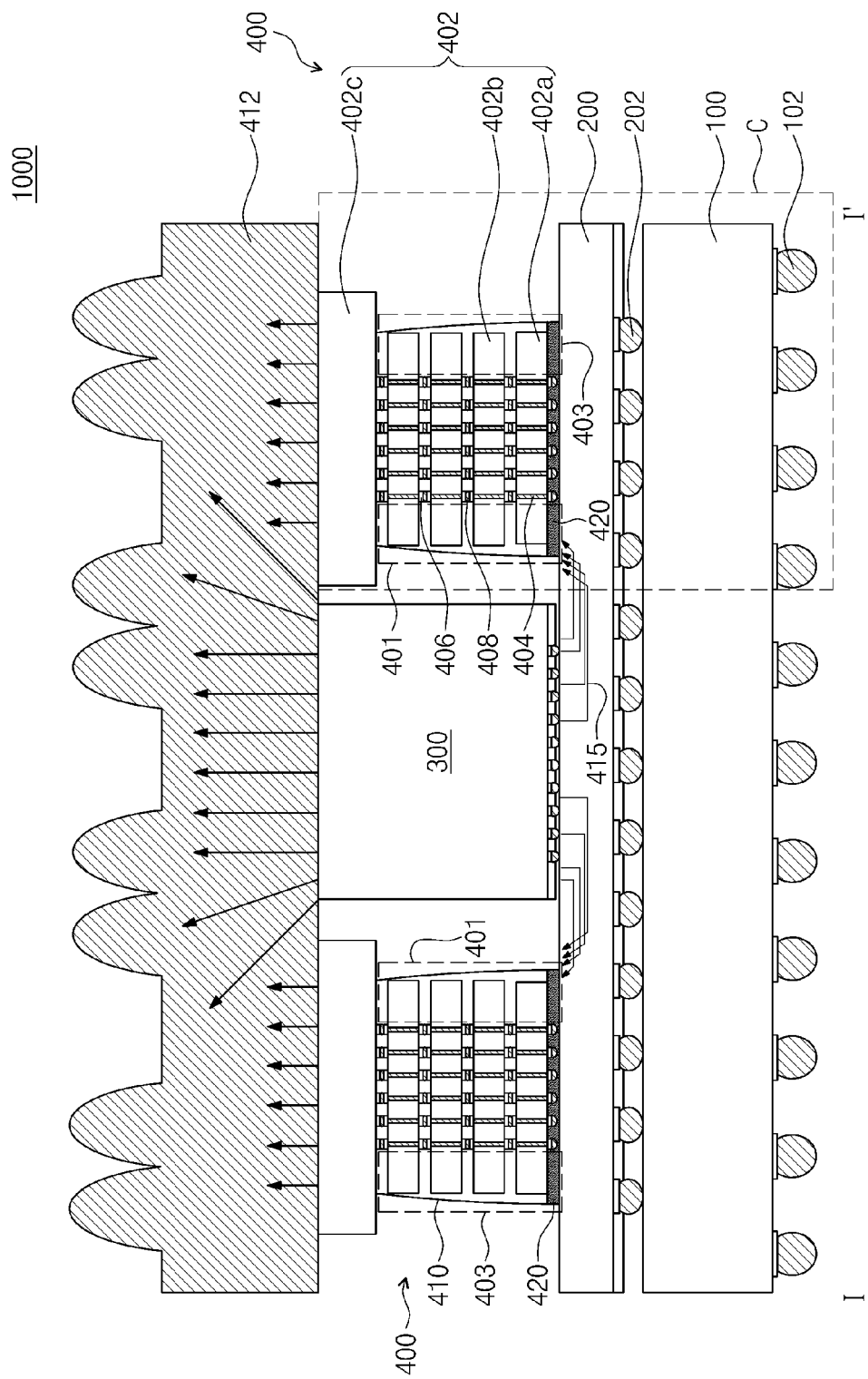
FIG. 5 is a cross-sectional view taken along a line II-II' of FIG. 1 to illustrate a semiconductor device including a semiconductor package according to a second embodiment of the present disclosure.
Figure 6:
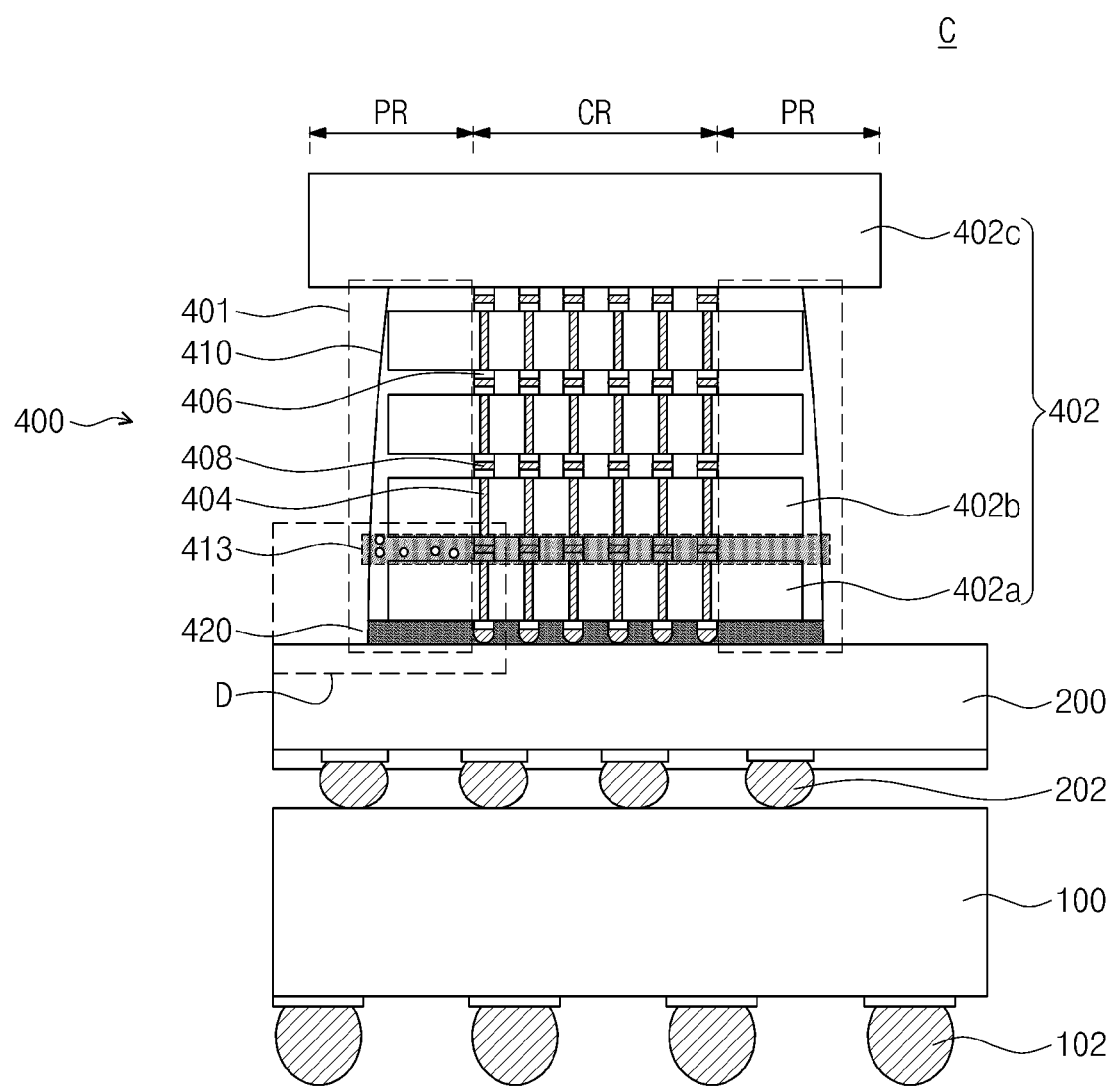
FIG. 6 is an enlarged view of a portion 'C' of FIG. 5 to illustrate a semiconductor device including a semiconductor package according to the second embodiment of the present disclosure.
Figure 7A:
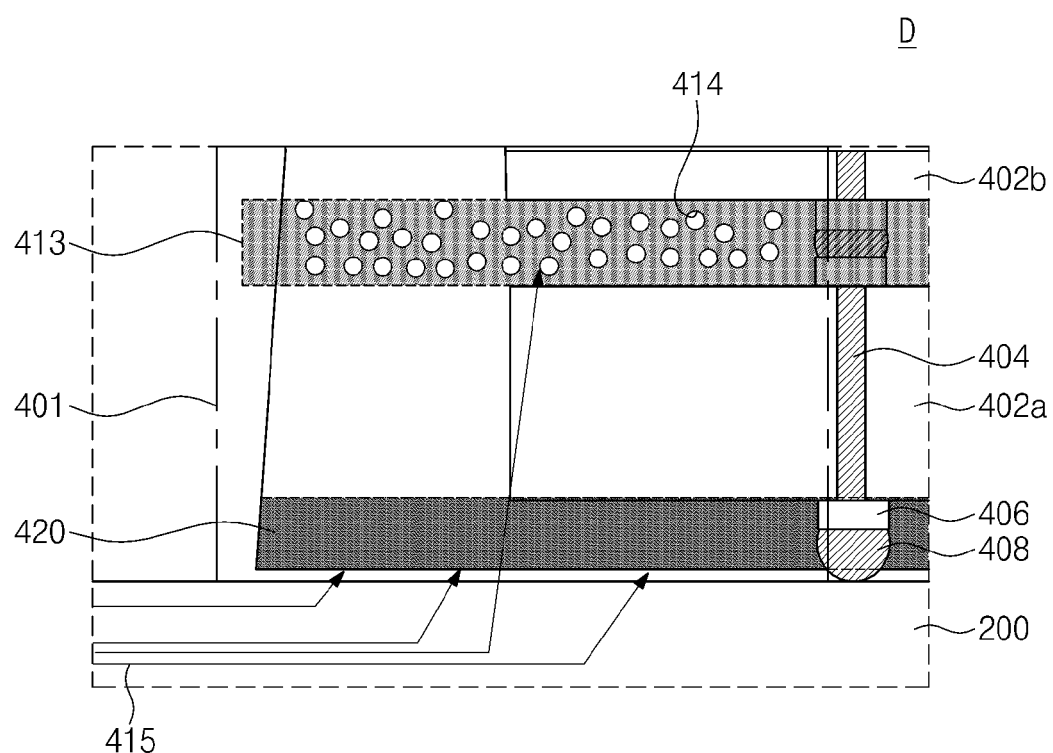
FIGS. 7A, 7B and 7C are enlarged views of a portion 'D' of FIG. 6 to illustrate a semiconductor device including a semiconductor package according to the second embodiment of the present disclosure.
Figure 7B:
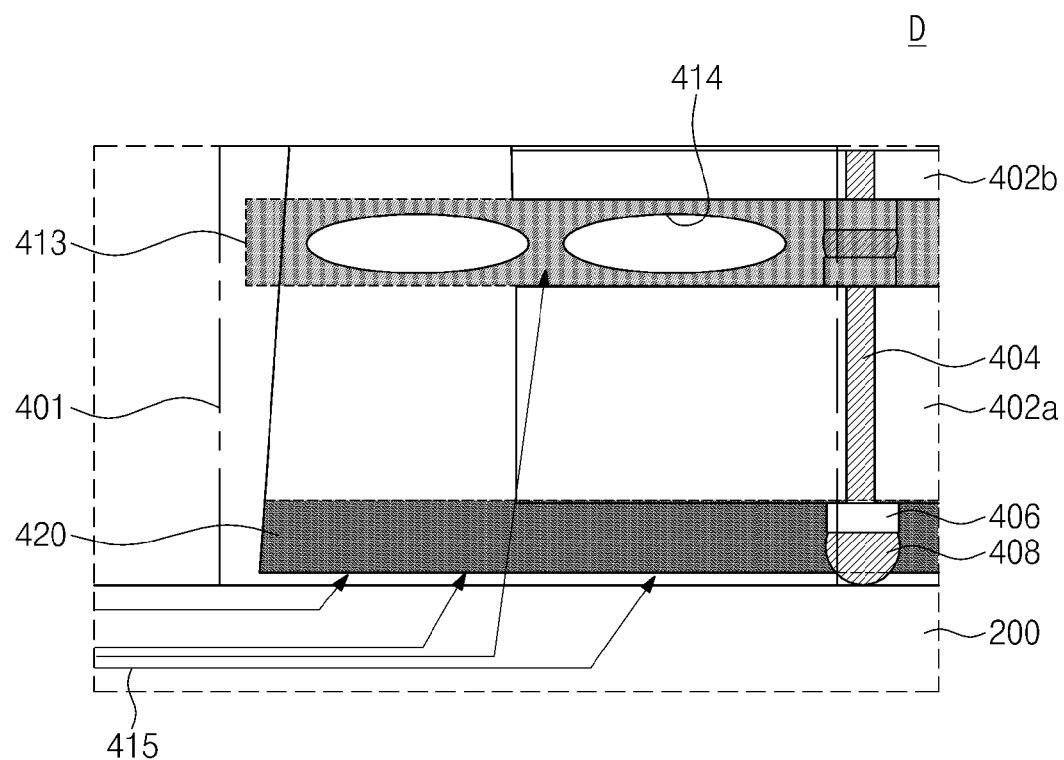
Figure 7C:
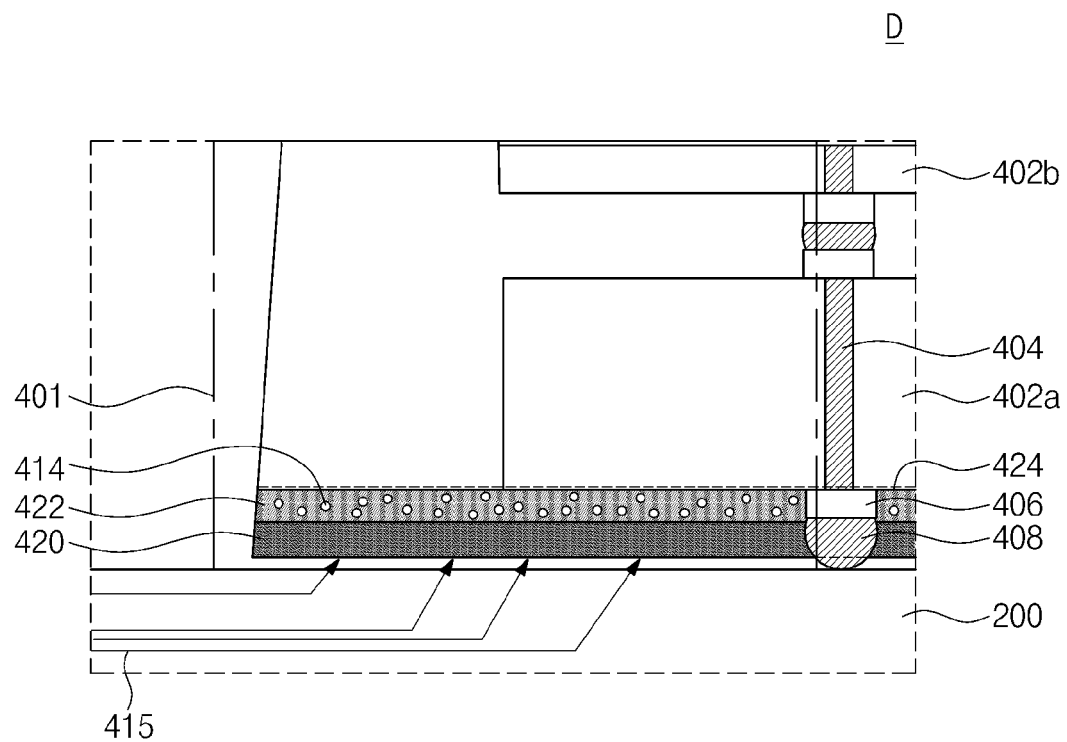

FIG. 5 is a cross-sectional view taken along a line I-I' of FIG. 1 to illustrate a semiconductor device including a semiconductor package according to a second embodiment of the present disclosure. FIG. 6 is an enlarged view of a portion 'C' of FIG. 5 to illustrate a semiconductor device including a semiconductor package according to the second embodiment of the present disclosure. FIGS. 7A, 7B and 7C are enlarged views of a portion 'D' of FIG. 6 to illustrate a semiconductor device including a semiconductor package according to the second embodiment of the present disclosure. In the second embodiment, the same elements as described in the first embodiment will be indicated by the same reference numerals or the same reference designators. For the purpose of ease and convenience in explanation, the descriptions to the same elements as in the first embodiment will be omitted or mentioned briefly.

Referring to FIGS. 5, 6, 7A, 7B and 7C, a semiconductor package 400 may include a heat-blocking layer 420 and an adhesion part 410. The heat-blocking layer 420 may cover a bottom surface 424 of the first semiconductor chip 402a. The adhesion part 410 may be disposed on the heat-blocking layer 420 to bond the semiconductor chips 402 to each other and to cover the sidewalls of the semiconductor chips 402. The heat-blocking layer 420 may be formed of Teflon. The Teflon may have a heat conductivity of 0.05 W/mK.

The heat 415 transmitted from the first semiconductor package 300 through the interposer substrate 200 and/or the interconnections may be blocked by the heat-blocking layer 420. Thus, the semiconductor chips of the second semiconductor package 400 may be shielded from the heat 415. A portion of the heat 415 which is not blocked by the heat-blocking layer 420 may be blocked by the voids 414 formed in a portion of the adhesion portion 413 of the adhesion part 410 which is disposed in the first region 401 of the second semiconductor package 400 as shown in FIG. 6, FIGS. 7A and 7B.

In one embodiment illustrated in FIG. 7C, an adhesion portion 422 may be disposed above the heat-blocking layer 420. The adhesion portion 422 may include voids 414. In one embodiment, the voids 414 in the adhesion portion 422 may be distributed from one edge portion to an opposite edge portion of the first semiconductor chip. In another embodiment, the voids 414 in the adhesion portion 422 may be distributed in a portion corresponding to first region 401. In yet another embodiment, the voids 414 in the adhesion portion 422 may be distributed in a portion corresponding to first region 401 and another portion corresponding to the second region 403. Thus, the adhesion portion 422 may be used not only to bond the first semiconductor chip 402 but also as a heat-blocking structure to block the heat 415.

It should be noted that the heat-blocking structure should not be limited to the example embodiment described above. For example, the appropriate substance having low heat conductivity may be used in the heat-blocking structure. The heat-blocking structure may consist of one substance in the form of a layer or may consist of one or more substances mixed with the adhesive material.

Figure 8:
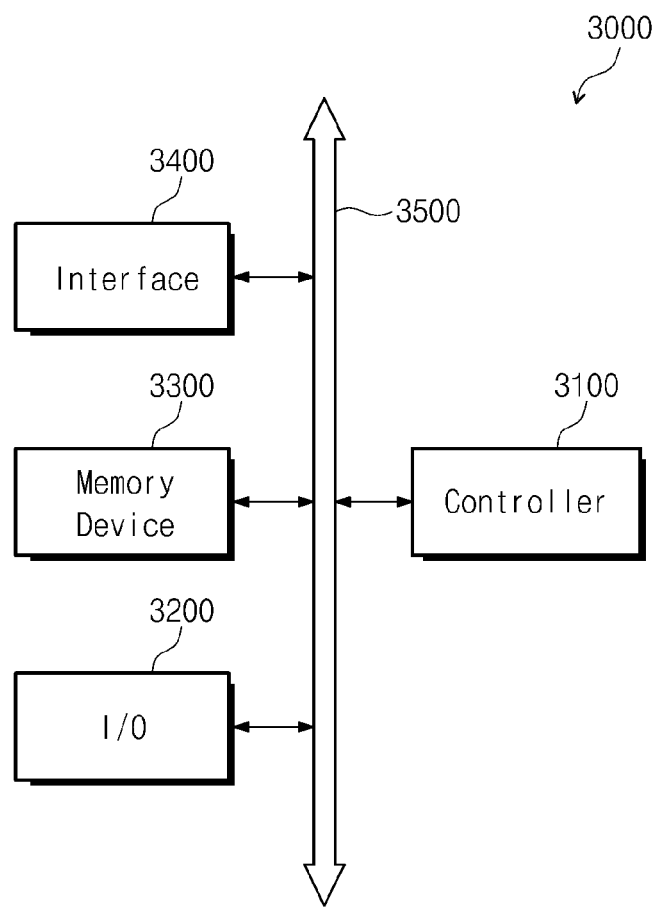
FIG. 8 is a schematic block diagram illustrating an embodiment of an electronic system including a semiconductor package according to the embodiments of the present disclosure.
Figure 9:
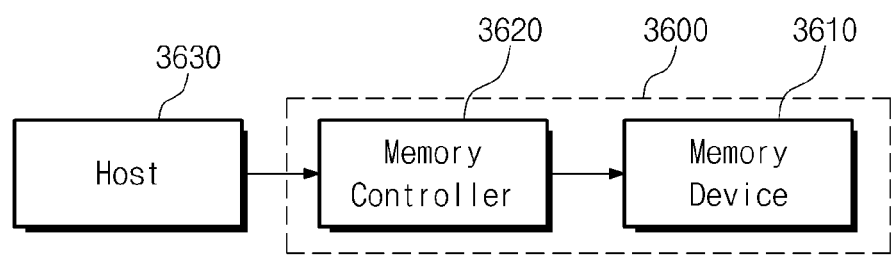
FIG. 9 is a schematic block diagram illustrating an embodiment of a memory system including a semiconductor package according to the embodiments of the present disclosure.

FIG. 8 is a schematic block diagram illustrating an embodiment of an electronic system including a semiconductor package according to embodiments of the present disclosure. FIG. 9 is a schematic block diagram illustrating an embodiment of a memory system including a semiconductor package according to embodiments of the present disclosure.

Referring to FIG. 8, an electronic system 3000 may include a controller 3100, an input/output (I/O) unit 3200, and a memory device 3300. The controller 3100, the I/O unit 3200, and the memory device 3300 may communicate with each other through the data bus 3500. The data bus 3500 may correspond to a path through which electrical data are transmitted. For example, the controller 3100 may include at least one of a microprocessor, a digital signal processor, a microcontroller, or another logic device having the same function as any one thereof. At least one of the controller 3100 and the memory device 3300 may include at least one of the semiconductor packages according to embodiments of the present disclosure. The I/O unit 3200 may include a keypad, a keyboard and/or a display device. The memory device 3300 is a device storing data. The memory device 3300 may store data and/or commands executed by the controller 3100. The memory device 3300 may include a volatile memory device and/or a non-volatile memory device. In an embodiment, the memory device 3300 may include a flash memory device. For example, the flash memory device implemented with the semiconductor package according to the present disclosure may be installed in the electronic system 3000 such as a mobile device and a desk top computer. The flash memory device may be realized as a solid state disk (SSD). In this case, the electronic system 3000 may stably store massive data in the flash memory device. The electronic system 3000 may further include an interface unit 3400 that is used to transmit electrical data to a communication network and/or to receive electrical data from the communication network. The interface unit 3400 may operate by wireless or cable. For example, the interface unit 3400 may include an antenna or a wireless/cable transceiver. In some embodiments, the electronic system 3000 may further include an application chipset and/or a camera image processor (CIS).

The electronic system 3000 may be realized as a mobile system, a personal computer, an industrial computer, or a logic system performing various functions. For example, the mobile system may be a personal digital assistant (PDA), a portable computer, a web tablet, a mobile phone, a wireless phone, a laptop computer, a memory card, a digital music player, or other electronic products receiving and/or transmitting information data. If the electronic system 3000 is a device capable of performing wireless communication, the electronic system 3000 may be used in a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, or MMDS.

Referring to FIG. 9, a memory system 3600 may include a non-volatile memory device 3610 and a memory controller 3620. The non-volatile memory device 3610 and the memory controller 3620 may store logical data and/or read stored data. The non-volatile memory device 3610 may include at least one of the semiconductor packages according to embodiments of the inventive concepts. The memory controller 3620 may control the non-volatile memory device 3610 to read stored data and/or to store data in response to read request and/or write request of a host 3630.

According to embodiments of the present disclosure, the semiconductor device may include the substrate, and the CPU and the semiconductor package disposed on the substrate. The semiconductor package may include the semiconductor chip and the adhesion part covering the semiconductor chip, and the void may be included in the portion of the adhesion part adjacent to the CPU. Thus, the heat which is generated from the CPU so as to be transmitted to the semiconductor package through the substrate may be blocked by the void.

While the present disclosure has been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:
1. A semiconductor device comprising:
a substrate;
a first semiconductor package disposed on the substrate; and
a second semiconductor package spaced apart from the first semiconductor package on the substrate, wherein the second semiconductor package comprises:
a semiconductor chip stacked on the substrate; and
an adhesion part covering the semiconductor chip;
wherein the adhesion part comprises: a first adhesion portion under the semiconductor chip; and a second adhesion portion on the semiconductor chip,
wherein the first adhesion portion includes voids in a first region of the second semiconductor package which is adjacent to the first semiconductor package.

2. The semiconductor device of claim 1, wherein the first adhesion portion includes the voids wherein a volume of the voids is greater in the first region than in a second region of the second semiconductor package which is disposed opposite the first region and away from the first semiconductor package.

3. The semiconductor device of claim 2, wherein the second semiconductor package further comprises: a second semiconductor chip stacked on the semiconductor chip with the second adhesion portion interposed therebetween,
wherein the second adhesion portion includes voids in the first region adjacent to the first semiconductor package.

4. The semiconductor device of claim 3, wherein the voids of the second adhesion portion has a volume greater in the first region than that in the second region.

5. The semiconductor device of claim 2, wherein a volume of the voids is equal to about a quarter of a volume of the first adhesion portion.

6. The semiconductor device of claim 1, further comprising:
a third semiconductor package on the substrate,
wherein the second semiconductor package is disposed at a side of the first semiconductor package,
wherein the third semiconductor package is disposed at another side of the first semiconductor package,
wherein the second and third semiconductor packages are spaced apart from the first semiconductor package, and
wherein the third semiconductor package has the same structure as the second semiconductor package.

7. A semiconductor package comprising:
a substrate;
a first semiconductor chip and a second semiconductor chip stacked on the substrate, the first semiconductor chip being nearest to the substrate;
an adhesion part covering the first and second semiconductor chips; and
a heat-blocking structure disposed between the substrate and the first semiconductor chip,
wherein the heat-blocking structure includes Teflon,
wherein the adhesion part includes an adhesion portion between the first semiconductor chip and the second semiconductor chip, and
wherein the adhesion portion includes voids in a first region adjacent to one edge of the first semiconductor chip.

8. The semiconductor package of claim 7, wherein the adhesion portion further includes voids in a second region adjacent to another edge of the first semiconductor chip and a volume of the voids in the first region is greater than a volume of the voids in the second region.

9. A semiconductor device, comprising:
a substrate;
a first semiconductor package disposed on the substrate;
a second semiconductor package disposed on the substrate and spaced apart from the first semiconductor package, wherein the second semiconductor package has a first region at an edge portion which is adjacent to the first semiconductor package;
wherein the second semiconductor package wherein the second semiconductor package comprises:
a first semiconductor chip stacked on the substrate,
an adhesion part covering the first semiconductor chip,
a heat-blocking structure consisting of a substance with a heat conductivity less than that of the substrate, wherein the heat-blocking structure is disposed between the first semiconductor chip and the substrate to block heat generated from the first semiconductor package and transmitted to the substrate,
wherein the heat-blocking structure includes a first adhesion portion of the adhesion part having voids filled with air.

10. The semiconductor device of claim 9, wherein the voids in the first adhesion portion are distributed from the first region to a second region at an opposite edge portion of the second semiconductor package.

11. The semiconductor device of claim 9, wherein the voids in the first adhesion portion are distributed in a portion corresponding to the first region.

12. The semiconductor device of claim 9, wherein the second semiconductor package includes a second semiconductor chip stacked on the first semiconductor chip, wherein the adhesion part includes a second adhesion portion disposed between the second semiconductor chip and the first semiconductor chip, and wherein the second adhesion portion includes voids.

* * * * *